United States Patent [19]

Zur et al.

[11] Patent Number: 4,795,978

[45] Date of Patent: Jan. 3, 1989

[54] PREVENTION OF STEADY STATE TRANSVERSE MAGNETIZATION IN FAST IMAGING SEQUENCES

[75] Inventors: Yuval Zur, Herzalia; Peter Bendel, Rishon Le Zion, both of Israel

[73] Assignee: Fiscint Ltd., Haifa, Israel

[21] Appl. No.: 78,888

[22] Filed: Jul. 29, 1987

[51] Int. Cl.[4] ............................................. G01R 33/08
[52] U.S. Cl. ..................................... 324/309; 324/307
[58] Field of Search ................ 324/307, 309, 313, 314

[56] References Cited

U.S. PATENT DOCUMENTS

| | | | |
|---|---|---|---|
| 4,443,760 | 4/1984 | Edelstein et al. | 324/313 |
| 4,665,365 | 5/1987 | Glover et al. | 324/309 |

OTHER PUBLICATIONS

"Contrast in Rapid MR Imaging:T1 and T2 Weighted Imaging" by Buxton et al., vol. 11(1), pp. 7-16 (1987), J. Comp. Ass. Tomography.
"Mechanisms of Contrast in NMR Imaging" by Wehrli et al., J. Comp. Ass. Tom., vol. 8(3), pp. 369-380 (1984).
"Transverse Coherence in Rapid Flash NMR Imaging" by Frahm et al., J. Mag. Res., vol. 72, pp. 307-314 (1987).
"Visualization of Cerebral and Vascular Abnormalities by NMR Imaging. The Effects of Imaging Parameters on Contrast" by Crooks, L. E. et al., Radiology, vol. 144, pp. 843-852, (1982).
"Rapid Imaging Using Low Flip Angle Pulses" by Haase, A. et al., J. Mag. Res., vol. 66 (2), pp. 258-266 (1986).

Primary Examiner—Stewart J. Levy
Assistant Examiner—Louis M. Arana
Attorney, Agent, or Firm—Sandler & Greenblum

[57] ABSTRACT

Reduces artifacts in fast imaging sequences used in magnetic resonance imaging by changing the phase of the radio frequency pulse output of a synthesizer in order to prevent the transverse magnetization caused by the radio frequency pulses used for "tipping" aligned spins into the transverse plane from reaching a steady state condition. Steady state conditions are known to cause artifacts in the final images.

14 Claims, 4 Drawing Sheets

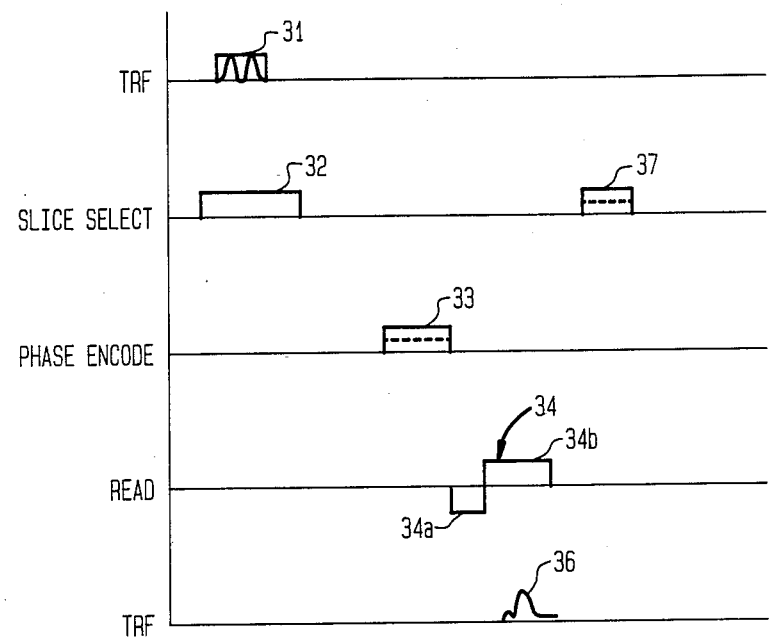
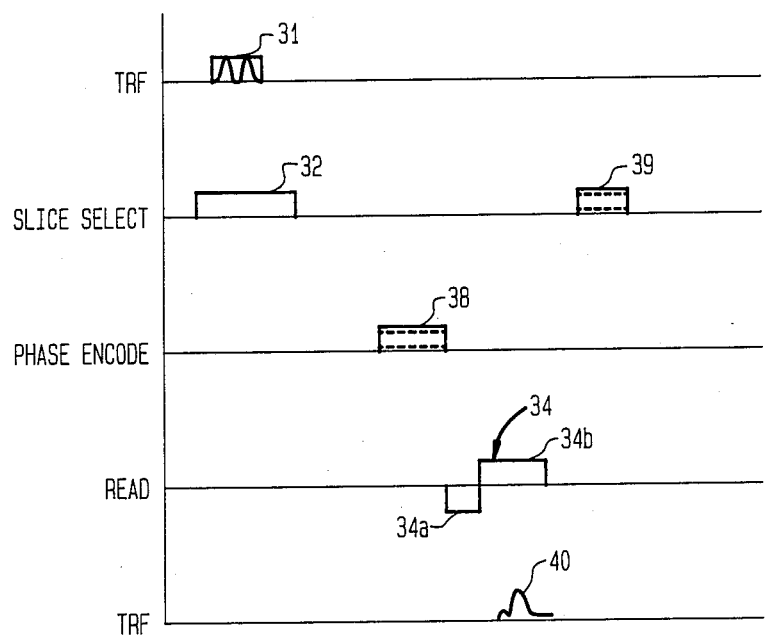

PREVENTION OF STEADY STATE TRANSVERSE MAGNETIZATION IN FAST IMAGING SEQUENCES

FIELD OF THE INVENTION

This application is concerned with magnetic resonance imaging (MRI) methods and more particularly with such methods and apparatus used for improving images acquired by fast imaging methods.

BACKGROUND OF THE INVENTION

Fast imaging is defined herein as imaging sequences where the time to repeat (TR) is less than the relaxation time T2. Fast imaging methods in general, use tip angles of less than 90 degrees with gradient recalled echoes rather than 180 degrees RF pulse generated echoes. This sequence often results in an image artifact in the form of a high intensity band around the center of the image. The artifact is caused by the contribution of the transverse magnetization (Mxy) to the steady-state condition prior to the application of the next radio frequency pulse. That is, any residual transverse magnetization remaining at the end of an acquisition period is transformed into unwanted phase coherence by the subsequent RF pulse.

See the following articles, for example prior art systems:

(1) "Contrast in Rapid MRI:T1 and T2 Weighted Imaging" by Buxton R. B. et al, published in the Journal of Computer Assisted Tomography, vol. 11, pp7–15, (1986);

(2) "Mechanisms of Contrast in NMR Imaging" by Wehrli, R. W. et al published in the Journal of Computer Assisted Tomography, vol. 8, pp369–380 (1984);

(3) "Transverse Coherence in Rapid Flash NMR Imaging" by Frahm J. et al published in the Journal of Magnetic Resonance, vol. 72, pp307–314 (1987).

(4) "Visualization of Cerebral and Vascular Abnormalities by NMR Imaging. The effects of Imaging Parameters on Contrast" by Crooks, L. E. et al published by Radiology, vol. 144, pp843–852 (1982); and (5) "Rapid NMR Imaging Using Low Flip Angle Pulses" published in the Journal of Magnetic Resonance, vol. 67, pp258–266 (1986).

Presently, there are no effective fast imaging systems which provide T1 contrast images and also remove the high intensity artifact. To remove the artifact, the transverse magnetization (Mxy) should be zero or close to zero prior to the application of the next RF pulse. The Mxy, unfortunately, does not naturally decay in the short time periods used by fast imaging procedures. Accordingly, it is necessary to manipulate various controls of the MRI systems to minimize or eliminate the Mxy magnetization.

One of the fast imaging methods presently used to obtain good T1 contrast images comprises the use of a "spoiler" gradient at the end of each sequence (prior to the next application of an RF pulse) and to change the spoiler gradient from cycle to cycle. The spoiler destroys the transverse (Mxy) magnetization coherence. A problem with the spoiler gradient method of eliminating transverse magnetization is that near the image center, the spoiler gradient is very small, and accordingly, near the center of the spoiler gradient, the Mxy magnetization is not eliminated. Actually the band in the image around zero is quite broad and for this reason when using the spoiler gradients, there is often a high intensity bright band around the zero in the direction of the spoiler gradient.

Another problem is the fact that the varying spoiler gradient creates varying eddy currents which further degrade longitudinal relaxation time T1 contrast.

In spin warp imaging, the incremental phase encoding gradient which varies from cycle to cycle acts to prevent the transverse magnetization from reaching a steady state. Here again at the center where the absolute value of the gradient is small the magnetization in the XY plane does tend to reach a steady state and there is an artifact along the center of the image. This signal from spins close to the center is brighter and more intense when compared to spins more distant from the center.

Presently, when using fast imaging sequences a refocusing method is used to get T2 (transverse relaxation time) contrast images. This method refocuses or cancels the defocusing effect of the phase encoding gradient. The refocusing gradients are applied between the sampling of the signal and the application of the next RF pulse by applying opposite going phase encoding pulses after signal acquisition and prior to application of the subsequent RF pulses. The opposite going phase encoded pulses refocus the coherence of the transverse magnetization Mxy, and steady state is established. This approach creates contrast which resemble those of a steady state free precession experiment. (Thus, the image generated contrast is approximately determined by T1/T2 and the overall image contrast is reduced). Accordingly, among other things, one fast imaging method ("spoiling fast scan") provides T1 contrasted images with serious artifact problems. While the other method ("refocusing fast scan") provides T1/T2 contrast but reduces the overall image contrast. Accordingly, a solution is required which provides good T1 contrast and essentially eliminates the artifact.

In this invention an elegant method of implementing the destruction of the coherence of the transverse magnetization is disclosed. The transverse magnetization is destroyed throughout all the image without creating eddy currents. Thus, this invention enables obtaining artifact-free images using fast imaging techniques with better T1 contrast than is done in the known prior art.

BRIEF DESCRIPTION OF THE INVENTION

According to a broad aspect of the present invention, an MRI system is provided, said system includes means for applying a fast imaging sequence, said sequence including at least one RF pulse having a certain phase relationship with spins that are in the rotating frame when the pulse is applied, and location independent means for changing the certain phase relationship between a subsequent RF pulse and the spins that are in the rotating frame prior to the time of the application of the subsequent RF pulse.

In accordance with a feature of the present invention the location independent means for changing the certain phase of the subsequent pulse comprises the synthesizer circuitry in the MRI system. The synthesizer circuitry as is well known supplies the frequencies to the transmitter that determine the transmission frequency of the RF pulses and the frequencies of operation of the signal receiver circuitry.

According to a related feature of the present invention the phase of the newly transmitted pulse relative to the spins in the XY plane prior to the newly transmitted pulses is changed for each subsequent RF pulse. In a preferred embodiment the change of the relative phase between the newly transmitted RF pulses and the spins in the XY plane due to prior RF pulses is accomplished by temporarily changing the frequency of the synthesizer after the data has been collected and switching back to the original frequency prior to transmitting the RF pulse during the next data acquisition portion of the sequence. The output of the synthesizer is continuous throughout the switching process. In effect, the change in frequency of the synthesizer varies the phase relationship between the new RF pulse and the spins in the XY plane due to the prior RF pulse. The phase relationship of the RF pulses as applied to the spins aligned with the main magnetic field remains the same as does the phase relationship between the transmitter and the receiver.

The method of the invention introduces a regularly implemented frequency offset in some range around zero to the synthesizer after each sampling of the signal. Before the next RF pulse is applied the synthesizer frequency is returned to the original frequency. The varying phase relationship between the RF pulses and the position of the spins in the rotating frame prevents establishment of a steady state condition for the transverse magnetization throughout the whole imaging space and thereby suppresses the T2 dependent contrast that adversely effected the T1 contrast in the prior art fast imaging methods.

It is important to note, that the frequency offsets are varied in steps that are large enough to prevent the transverse magnetization from reaching a steady state condition but at the same time are small enough to prevent large cycle to cycle variations which could lead to phase smearing or other such artifacts in the image. In a preferred embodiment that operates around 21 MHz the frequency is incremented in 50 Hz steps for 4 msec through a range extending from −4 KHz to +4 KHz.

In a preferred embodiment the sequence also includes a second phase encoding gradient pulse equal in area and opposite in amplitude to the first phase encoding gradient. When the opposite going phase encoding gradient pulse is not applied the phase variation of the encoding gradient pulses may cancel some of the phase variations provided by the frequency offset and a steady state transverse magnetization may still be reached at some position in the image; although, not necessarily at the center of the image.

BRIEF DESCRIPTION OF THE DRAWINGS

The above mentioned and other objects and features of the present invention will be best understood when considered in the light of the following description of a broad aspect of the present invention made with reference to the accompanying drawings; wherein:

FIG. 2 shows a portion of a fast imaging sequence of the prior art where an extra spoiler gradient is used to obtain T1 contrasted images;

GENERAL DESCRIPTION

Figure 1:
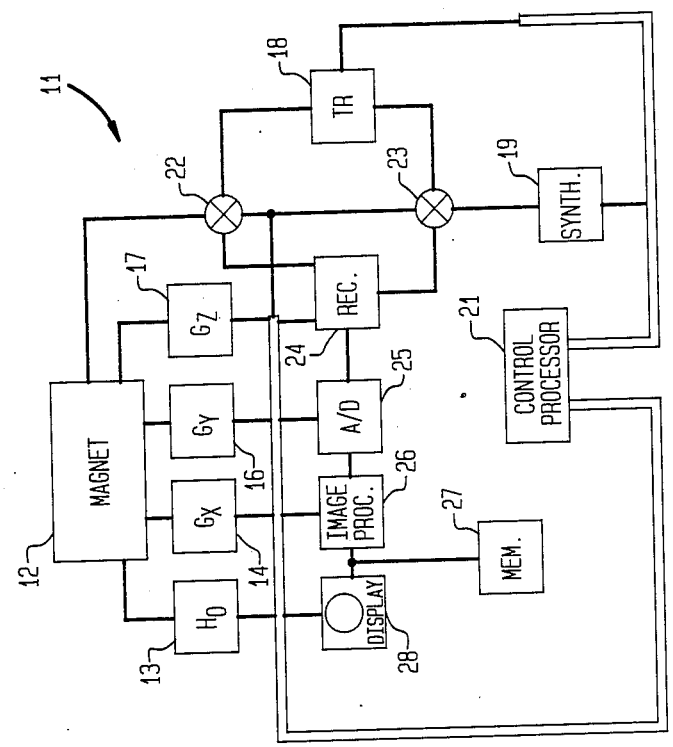
FIG. 1 shows a typical MRI system to which the invention applies.

FIG. 1 shows a typical MRI system 11 comprising a magnet 12 for receiving a patient therein. In a preferred embodiment the magnet is a superconducting magnet; but, within the scope of this invention, other types of magnets can be used.

A large static relatively homogeneous magnetic field Bo is generated by field generator Ho indicated at 13. The large static field causes certain nuclei ("spins") to align with the static field. Gradient fields are generated by the gradient field generators Gx indicated at 14, Gy indicated at 16, and Gz indicated at 17. The gradient fields are used to vary the large field in a known manner.

Means are provided for generated radio frequency (RF) pulses for "tipping" the aligned spins to the "XY" plane or so as to have a component in the XY plane. The means for tipping the spins comprises coils (not shown) in the magnet and the pulse transmitter 18. The pulse transmitter frequency is supplied by synthesizer 19 as controlled by a controller 21. The controller controls the timing and amplitudes of the outputs of the various component parts making up the MRI system. The transmitted pulse goes through a transmitter-receiver selection switch means 22 to the RF coil in the magnet. The synthesizer signal is coupled to the transmitter, when the system is in its transmitting mode, through switch means 23.

In the receiving mode the coil of the magnet senses free induction decay (FID) or echo signals caused by the spins that have been tipped into the XY plane. The received signal goes through switch 22, when it is switched by controller 21 into the receiving mode, to connect the RF coil to the receiver 24. The received signal then passes through an analog to digital converter 25. The digital output of converter 25 is applied to an image processor 26 having an associated memory 27 to provide an image to display unit 28 using reconstruction methods such as Fast Fourier Transforms.

FIG. 2(a) shows a portion of a prior art fast imaging sequence which uses spoiler gradients to obtain T1 contrasted images. Therein, a radio frequency (RF) pulse 31 is shown on the radio frequency transmitter line TRF. The pulse 31 tips the spins in the MRI system to the XY plane. A slice select gradient 32 is provided during the application of the RF pulse. One of the series of phase encoding pulses that are applied during the entire acquisition sequence is shown at 33. A read pulse 34 comprising portions 34a and 34b is provided. The sign reversed portion 34a is a dephasing lobe which acts with the read-out portion 34b to generate the echo signal 36. Subsequently, a spoiler phase gradient pulse 37 is applied in an attempt to destroy the coherence of the spins in the XY plane of the rotating frame. The spoiler pulses near zero are small and fail to destroy the coherence. Therefore, the image of such sequences are plagued with contrast artifacts around zero. In addition, the spoiler pulses cause serious eddy current problems.

FIG. 2(b) also shows that portion of the scan sequence that is accomplished by the next phase encoding gradient pulse. Everything is the same in FIG. 2(b) as in FIG. 2(a) except that both the phase encoding pulse and the spoiler phase encoding pulse have changed. The changes are indicated by the use of indicating numbers 38 and 39 in place of the numbers 33 and 37 of FIG. 2(a). Of course a different signal 40 is sampled in FIG. 2(b) in place of the signal 36 of FIG. 2a. It is important to note that the phase of the XY components of the magnetization prior to the RF pulses transmitted during the sequence remains the same in FIG. 2(a) and 2(b). Thus, if there is no change in the relationship between the RF pulses and the nutated spins from RF pulse to RF pulse, the system attains a steady state. The spoiler pulses 37, 39 are used in an attempt to thwart the tendency to attain a steady state. The spoiler pulses are used to destroy the coherence surviving in the XY plane from the portions of the sequence occuring prior to the application of RF pulses 31. The spoiler pulses 37, 39 may be linearly changing or randomly changing in the prior art. In both cases, but more so when the spoiler pulses change randomly, they generate unwanted, deleterious eddy currents.

Figure 3A:
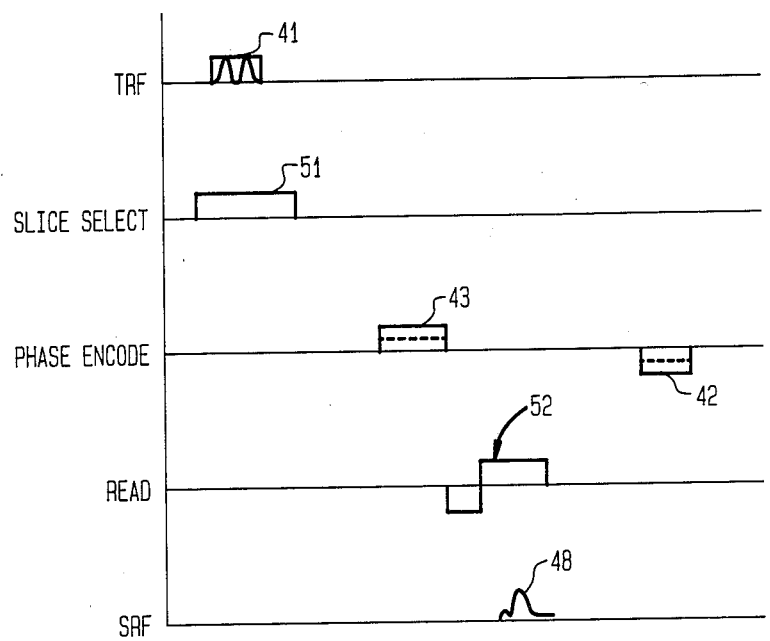
FIG. 3 shows a portion of the fast imaging sequence of the present invention where in the lab frame the phase of the subsequent RF pulse relative to the already tipped spins is varied.
Figure 3B:
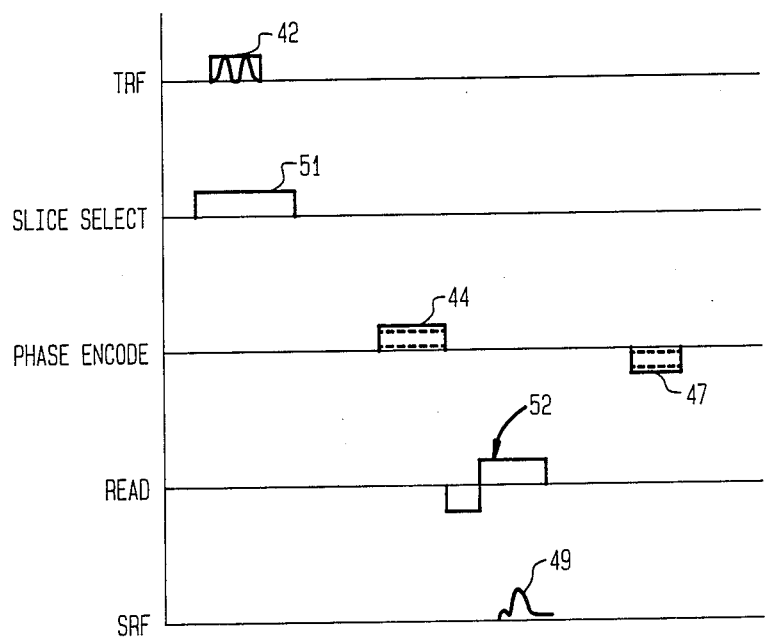

FIG. 3 shows a portion of a unique fast imaging sequence that enables good image contrast and especially good image T1 contrast without the artifacts experienced using prior art fast imaging sequences. More particularly FIGS. 3(a) and 3(b) illustrate a fast imaging sequence wherein there is a difference between the phase relationship of RF pulse 41 and RF pulse 42 relative to the spins in the rotating plane immediately prior to these pulses. This phase difference tends to eliminate the coherence of spin components in the XY plane prior to the RF pulses. To illustrate this changing phase relationship pulses 41 and 42 are drawn with exaggerated phase differences.

The difference between the sequences of FIGS. 3(a) and 3(b) are in:

(1) the phase encoding pulses 43 and 44, (2) pulses 41 and 42 are shown as having different phases, this phase difference is relative to the spins in the rotating frame, (2) the phase encoding refocusing pulses 47, and (3) the output signal 48 and 49.

The slice selecting gradient 51 and the echo generating read gradient pulses 52 are the same in each of the portions of the scan sequences shown in FIGS. 3(a) and 3(b).

The differences between the prior art scan sequence of FIG. 2 and the inventive sequence of FIG. 3 is that in FIG. 3 there is a phase difference between the RF pulses 41, 42 and the spins in the rotating frame; while, there is no phase difference between the RF pulses of FIG. 2 and the spins of the rotating frame. In addition the sequence of FIG. 3 does not use the "spoiler" pulses 37, 39 shown in FIG. 2 but it may use refocusing pulses 47 as shown in FIG. 3. The refocusing pulses may be used to avoid those cases wherein the varying phase between the RF pulses relative to the spins already in the XY plane coincide with and accordingly are cancelled by the phase steps of the phase encoding pulses.

Figure 4:
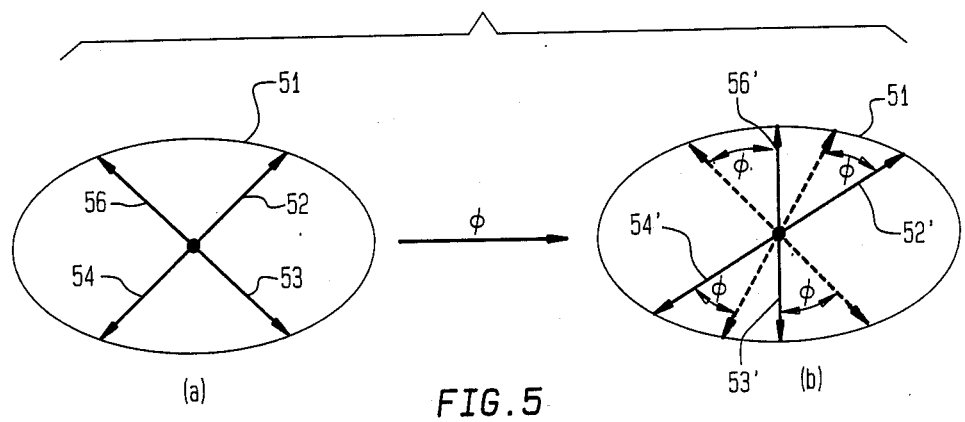
FIG. 4 is an illustration of the effect of the phase variation on the rotating frame of the synthesizer.

FIG. 4 shows a view of the rotating frame before and after it has been subjected to a phase change. At FIG. 4(a) the rotating frame 51 is shown as having tipped spins 52, 53, 54 and 56 thereon due to prior RF pulses. FIG. 4(b) shows the rotating frame after it has been subjected to a phase change $\phi$. In effect the phase change delays (or advances) the spins 52, 53, 54 and 56 by the phase angle $\phi$. The newly located spins are indicated as spins 52', 53', 54' and 56'. Thus FIG. 4 illustrates that a change of phase $\phi$ in the output of the synthesizer changes the phase $\phi$ of the spins in the synthesizer rotating frame.

Figure 5:
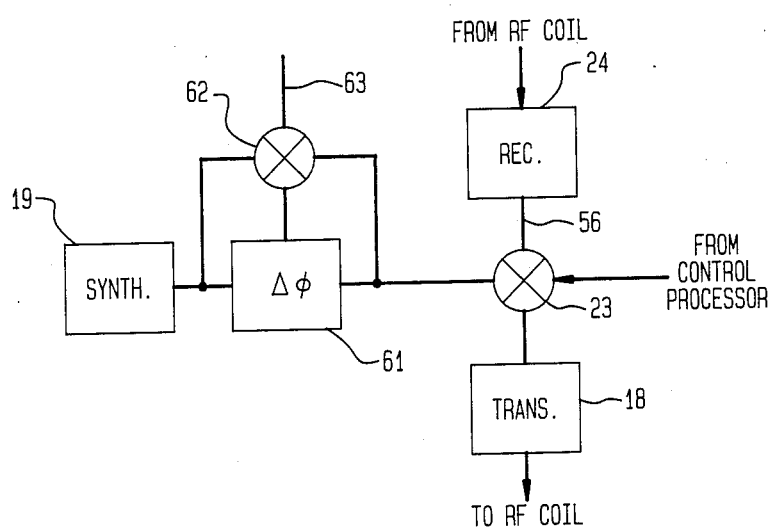
FIG. 5 is a block diagram showing a phase varying circuit at the output of the synthesizer of the MRI system described herein.

FIG. 5 shows a circuit 61 that can change the phase at the output of the synthesizer 19 relative to the spins in the rotating frame. The output of the synthesizer is normally connected through switching gate 62, conductor 64, switching gate 23, conductor 66 to receiver 24 or transmitter 18. Responsive to a signal from controller 21 on conductor 63, the switching gate 62 causes phase varying circuit 61 to operate and closes the connection from the synthesizer 19 to conductor 64. Circuit 61 receives its input from the synthesizer 19. The phase varied output of circuit 61 is connected from transmitter 18 to the RF coil. The switch 23 connects receiver 24 to the RF coil during receive time, and transmitter 18 is connected to the RF coil during the RF pulse transmissions. The output of the transmitter is in phase with the synthesizer output and out of phase with the spins tipped by the previous RF pulse.

Figure 6:
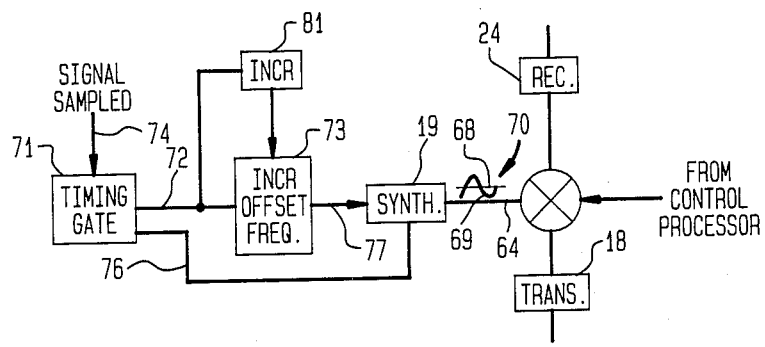
FIG. 6 shows a preferred embodiment for obtaining the phase variations of the synthesizer circuit output.

There may be many arrangements for varying the phase of the synthesizer output signal relative to the phase of the spins already in the XY plane. In a preferred embodiment the arrangement of FIG. 6 is used. As shown therein, timing gate 71 provides a control signal at its output on conductor 72 to activate an incremental resonant offset frequency control circuit 73 which causes the synthesizer 19 to generate an output frequency that is changed from its normal frequency by a given amount. The timing gate 71 is operated responsive to the sampling of the echo signal as indicated by arrow 74. The transmitter and receiver are disconnected from the RF coil by switch 23 during the time that there is a signal on conductor 72.

After a set period of time the gate 71 resets and a control signal is produced at its output connected to conductor 76. Simultaneously, the control signal on conductor 72 terminates. The presence of the control signal on conductor 76 and the absence of the control signal on conductor 72 causes the synthesizer 19 to provide its normal frequency output once again and removes the incremental offset frequency control signal at the output 77 of circuit 73. Then the controller calls for the next RF pulse by sending a signal to connect switch 23, to the transmitter, which transmits a signal on conductor 66 that passes through the RF coil in the magnet.

After the next signal is sampled the timing gate once again turns on the offset frequency which is incremented by frequency increment circuit 81. In a preferred embodiment the incremental steps are 50 Hz. There are 160 steps totaling 8000 Hz centered at the normal output frequency of 21.5 MHz. Thus, the resonant offset frequencies extend from 21.5 MHz $-4$ KHz to 21.5 MHz $+4$ KHz. The timing gate resets prior to the time for transmitting the next RF pulse. The resetting of the timing gate signals the synthesizer over conductor 76 to transmit its normal RF pulse. However, due to the incremental frequency offset, the RF pulse now has changed phase relative to previously tipped spins. In this manner the phase of the transmitted pulse relative to the spins already in the rotating frame changes for each RF pulse. The varying phase prevents coherence and thereby enables the fast imaging sequence of FIG. 3, to provide artifact free images having good T1 contrast. The phase increments between the sequential RF pulses and the spins in the XY plane immediately prior to these pulses should be large enough to prevent the spins of the rotating frame from reaching a steady state condition.

The above method as described offers an important advantage over the previously suggested approach of applying a further gradient of randomized or incremented amplitudes after signal sampling in each cycle. As previously explained there is always a region around the zero point or the origin of the gradient where there is effectively no variation. Moreover, a spoiler gradient with varying amplitude also creates varying eddy currents; which because, of the short time to repeat of fast imaging scan sequences persist to the next cycle. This persistence causes phase problems and lowers the signal to noise ratio. These are among the problems that are avoided by the inventive provision of the offset frequency to the synthesizer.

While the invention has been explained using certain embodiments it should be understood that these embodiments are exemplary only and are not to be used in any way as limitations on the scope of the invention which is defined by the accompanying claims.

What is claimed is:

1. A magnetic resonance imaging system for preventing steady state transverse magnetization in a transverse plane when using fast imaging sequences, said system including: means for applying fast imaging sequences including transmitter means for transmitting a radio frequency (RF) pulse having a certain phase relationship with spins that are in the rotating frame to tip said spins to a first position in said transverse plane, and varying means for causing the phase relationship between a subsequent RF pulse and spins that are in the rotating frame at the time the subsequent RF pulse is applied to be different than said certain phase relationship to tip said spins to a second position in said transverse plane removed from said first position by less than 180 degrees.

2. The magnetic resonance imaging system of claim 1 wherein said varying means comprises location independent means.

3. The magnetic resonance imaging system of claim 2 wherein said varying means comprises synthesizer means, said synthesizer means providing controlled frequencies for the transmitter of the RF pulse of the magnetic resonance imaging system, and
means for changing the phase of the output of the synthesizer relative to spins that are in the rotating frame to thereby change the phase of the RF pulse relative to spins in the rotating plane.

4. The magnetic resonance imaging system of claim 3 wherein means are provided for changing the phase of the synthesizer output per time to repeat a sequence of the fast imaging sequences.

5. The magnetic resonance imaging system of claim 4 wherein said varying means for changing the phase of the synthesizer output per time to repeat the fast imaging sequence comprises means for changing the phase in ordered steps for each time to repeat the fast imaging sequences.

6. The magnetic resonance imaging system of claim 1 wherein said varying means comprises means for varying the output frequency of a synthesizer after the last radio frequency pulse of a sequence cycle and returning the output frequency to the original output frequency prior to the first RF pulse of the next sequence cycle.

7. The magnetic resonance imaging system of claim 5 wherein the steps comprise 50 cycle steps ranging over 1600 mHz.

8. A resonance imaging method for preventing steady state magnetization in a transverse plane when applying fast imaging sequences, said method including the steps of:
applying fast imaging sequences, said sequences including the step of applying a first radio frequency (RF) pulse having a certain phase relationship with spins that are in the rotating frame to tip said spins to a first position in said transverse plane, and
changing the phase relationship between a subsequently applied RF pulse and spins that are in the rotating frame at the time of applying the subsequently applied RF pulse is applied to assure that said phase relationship is different than said certain phase relationship and to tip said spins to a second position in said transverse plane removed from said first position by less than 180 degrees.

9. The magnetic resonance imaging method of claim 8 wherein the changing step uses location independent means.

10. The magnetic resonance imaging system of claim 9 wherein said changing step includes the steps of:
providing controlled frequencies for the transmitter of the RF pulse of the magnetic resonance imaging system, and
changing the phase of the controlled frequencies to thereby change the phase of the output of the RF pulse relative to spins in the transverse plane.

11. The magnetic resonance imaging method of claim 10 including the step of changing the phase of the control frequencies per time to repeat a sequence of the fast imaging sequences.

12. The magnetic resonance imaging method of claim 10 wherein said step of changing the phase of the controlled frequencies per time to repeat a sequence of the fast imaging sequences comprises changing the phase in ordered steps for each time to repeat a sequence of the fast imaging sequences.

13. The magnetic resonance imaging method of claim 8 wherein said step of changing the phase comprises varying controlled frequencies after the last RF pulse of a sequence cycle and returning the controlled frequencies to the original controlled frequency prior to applying the first RF pulse of the next sequence cycle.

14. The magnetic resonance imaging method of claim 12 wherein the steps comprise 50 cycle steps ranging over 1600 mHz.

* * * * *